(12) United States Patent
Matsuno et al.

(10) Patent No.: US 8,378,472 B2
(45) Date of Patent: Feb. 19, 2013

(54) MOUNTING STRUCTURE FOR SEMICONDUCTOR ELEMENT WITH UNDERFILL RESIN

(75) Inventors: Koso Matsuno, Osaka (JP); Atsushi Yamaguchi, Osaka (JP); Shigeaki Sakatani, Osaka (JP); Hidenori Miyakawa, Osaka (JP); Mikiya Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 105 days.

(21) Appl. No.: 12/738,430

(22) PCT Filed: Oct. 16, 2008

(86) PCT No.: PCT/JP2008/002927
§ 371 (c)(1),
(2), (4) Date: Apr. 16, 2010

(87) PCT Pub. No.: WO2009/050891
PCT Pub. Date: Apr. 23, 2009

(65) Prior Publication Data
US 2010/0224398 A1 Sep. 9, 2010

(30) Foreign Application Priority Data
Oct. 17, 2007 (JP) .................. 2007-269588

(51) Int. Cl.
*H01L 23/22* (2006.01)
(52) U.S. Cl. ........ 257/678; 257/687; 257/789; 257/795; 257/E23.121; 257/E23.001

(58) Field of Classification Search .......... 438/106–127; 257/678, 687, 789, 795
See application file for complete search history.

(56) References Cited

U.S. PATENT DOCUMENTS

| 5,647,123 A | 7/1997 | Greenwood et al. |
| 6,368,895 B1 | 4/2002 | Hori |
| 2001/0013641 A1 | 8/2001 | Onodera et al. |
| 2003/0178716 A1* | 9/2003 | Maeda et al. ................. 257/686 |
| 2005/0178581 A1 | 8/2005 | Lee et al. |
| 2006/0267171 A1 | 11/2006 | Lee |
| 2008/0153206 A1* | 6/2008 | Stoneham et al. ............ 438/109 |
| 2011/0171780 A1* | 7/2011 | Kado et al. .................... 438/113 |

FOREIGN PATENT DOCUMENTS

| JP | 2001-035886 | 2/2001 |
| JP | 2002-208670 | 7/2002 |
| JP | 2004-158474 | 6/2006 |
| JP | 2006-237367 | 9/2006 |
| JP | 2006-245187 | 9/2006 |
| JP | 2007-134540 | 5/2007 |

* cited by examiner

*Primary Examiner* — Thanh Nguyen
(74) *Attorney, Agent, or Firm* — Hamre, Schumann, Mueller & Larson, P.C.

(57) ABSTRACT

In order to easily inject underfill resin and perform molding with reliability, groove sections are formed on a surface of a circuit board such that the ends of the groove sections extend to semiconductor elements. Low-viscosity underfill resin applied dropwise is guided by the groove sections and flows between the circuit board and the semiconductor elements. The underfill resin hardly expands to regions outside the semiconductor elements.

9 Claims, 8 Drawing Sheets

MOUNTING STRUCTURE FOR SEMICONDUCTOR ELEMENT WITH UNDERFILL RESIN

TECHNICAL FIELD

The present invention relates to a mounting structure in which semiconductor elements are mounted on a circuit board, and particularly relates to a mounting structure in which underfill resin is applied to surface-mounted semiconductor elements.

BACKGROUND ART

In recent years, high-density packing has been demanded for circuit boards of electronic equipment to achieve size reduction, weight reduction, higher performance, and higher speed for the electronic equipment. For this reason, mounting structures have been reduced in size and thickness and become faster with an increased number of terminals. A mounting structure contains electronic components and chip components to be mounted on circuit boards, semiconductor elements in a BGA (Ball Grid Array), semiconductor elements in a LGA (Land Grid Array) where flat electrode pads are arranged in a grid-like fashion instead of solder balls of BGA, and semiconductor elements in a CSP (Chip Size Package). Consequently, mounting structures have decreased in mechanical strength and the number of mounting structures susceptible to an applied mechanical stress and a temperature change has increased.

In a typical method of mounting a semiconductor element on a circuit board, the electrodes of the semiconductor element are brought into contact with predetermined positions on the circuit board, a solder material or a conductive adhesive is supplied between electrodes to be connected, the semiconductor element and the circuit board are placed into a reflow furnace and the like to join the electrodes of the semiconductor element and the circuit board, and a gap between the semiconductor element and the circuit board is molded with a underfill resin material together with portions around joints concurrently with or before or after the joining operation.

The semiconductor element is bonded and fixed to the circuit board through the resin molding, so that the joints can be protected with high reliability even when the semiconductor element is exposed to a heat cycle or a hot and humid environment after the resin molding.

Further, in the resin molding, a fillet formed around the semiconductor element considerably affects the reliability of the semiconductor element and thus it has been requested to stably form fillets.

FIG. 8A shows a mounting structure in which semiconductor elements 1b and 1b are surface-mounted on a circuit board 2. FIG. 8B shows a state before underfill resin 3 is applied. FIG. 8C shows a state in which the underfill resin 3 has been applied between the semiconductor element 1b and the circuit board 2 and between the semiconductor element 1b and the circuit board 2.

FIG. 9A shows the circuit board 2 before the semiconductor elements 1b and 1b are mounted. FIG. 9B is a sectional view taken along line X-X of FIG. 9A. The overall mounting surface of the circuit board 2 is formed as a ground pattern 5, except for lands 4 on which the semiconductor elements 1b and 1b are mounted.

In this case, as indicated by arrows in FIG. 8A, the low-viscosity underfill resin 3 is injected in small quantities by a syringe and the like from locations around the semiconductor elements 1b and 1b according to the current state of the art.

Patent Document 1 describes a technique in which dams are provided around the semiconductor elements 1b and 1b to prevent the injected underfill resin 3 from flowing outside.

Patent Document 1: Japanese Patent Laid-Open No. 2006-237367

DISCLOSURE OF THE INVENTION

Problem to be Solved by the Invention

In the prior art, the dams provided around the semiconductor elements make it possible to control the shape of the underfill resin after the injection. However, it is quite difficult to inject the underfill resin in small quantities around the semiconductor elements and the semiconductor elements cannot be stably molded. Thus an improvement has been demanded in the current state of the art.

An object of the present invention is to provide a mounting structure in which underfill resin can be easily injected and semiconductor elements can be stably molded with the underfill resin.

Means for Solving the Problem

A mounting structure of the present invention in which a first semiconductor element and a second semiconductor element are surface-mounted next to each other on the top surface of a circuit board, wherein the mounting structure has a groove section formed between the adjacent semiconductor elements on the pattern of the circuit board, the groove section has one end formed to a position under the first semiconductor element, the groove section has the other end formed to a position under the second semiconductor element, a gap between the pattern of the circuit board and the first semiconductor element is molded with underfill resin, a gap between the pattern of the circuit board and the second semiconductor element is molded with the underfill resin, and the groove section is so deep as to guide the underfill resin supplied into the groove section to the gap between the pattern of the circuit board and the first semiconductor element and the gap between the pattern of the circuit board and the second semiconductor element.

A mounting structure of the present invention in which a first semiconductor element and a second semiconductor element are surface-mounted next to each other on the top surface of a circuit board, wherein the mounting structure has a groove section formed between the adjacent semiconductor elements on a resist formed on the pattern of the circuit board, the groove section has one end formed to a position under the first semiconductor element, the groove section has the other end formed to a position under the second semiconductor element, a gap between the pattern of the circuit board and the first semiconductor element is molded with underfill resin, a gap between the pattern of the circuit board and the second semiconductor element is molded with the underfill resin, and the groove section is so deep as to guide the underfill resin supplied into the groove section to the gap between the pattern of the circuit board and the first semiconductor element and the gap between the pattern of the circuit board and the second semiconductor element.

Further, the underfill resin is formed over the groove section.

Moreover, the first semiconductor element and the second semiconductor element are spaced at an interval not larger than 5 mm.

Further, the groove section is oriented perpendicularly to the direction of a side of the first semiconductor element and the direction of a side of the second semiconductor element.

Moreover, the plurality of groove sections are formed.

Advantage of the Invention

According to a mounting structure of the present invention, it is possible to perform molding by efficiently and stably injecting a resin material into a gap between a circuit board and a semiconductor element surface-mounted on the circuit board.

BEST MODE FOR CARRYING OUT THE INVENTION

Referring to FIGS. 1A, 1B to 7, embodiments of the present invention will be described below.

First Embodiment

FIGS. 1A, 1B to 4A, and 4B show a first embodiment of the present invention.

Figure 1A:
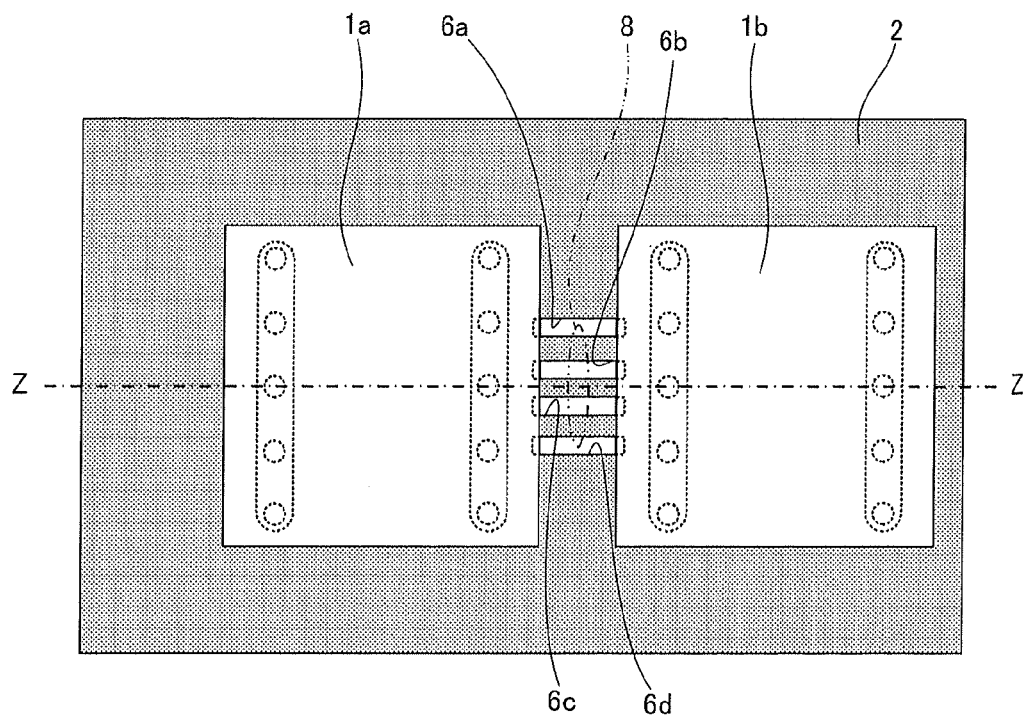
FIG. 1A is a plan view showing a mounting structure according to a first embodiment of the present invention.

FIG. 1A shows a mounting structure in which semiconductor elements 1b and 1b are surface-mounted on a circuit board 2.

Figure 1B:
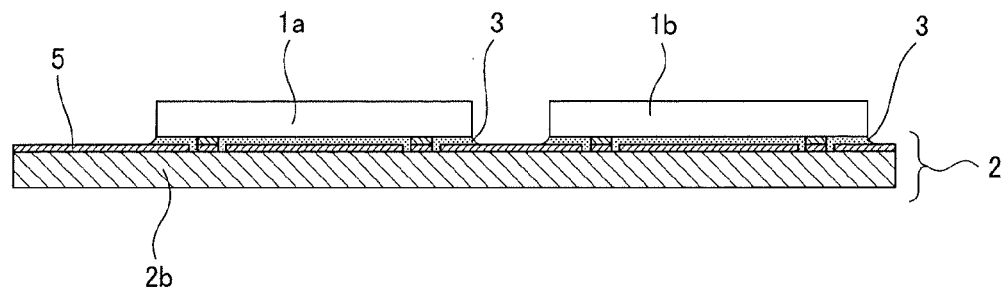
FIG. 1B is a sectional view taken along line Z-Z according to the first embodiment.

FIG. 1B is a sectional view taken along line Z-Z of FIG. 1A and shows a state in which underfill resin 3 has been applied.

Figure 2A:
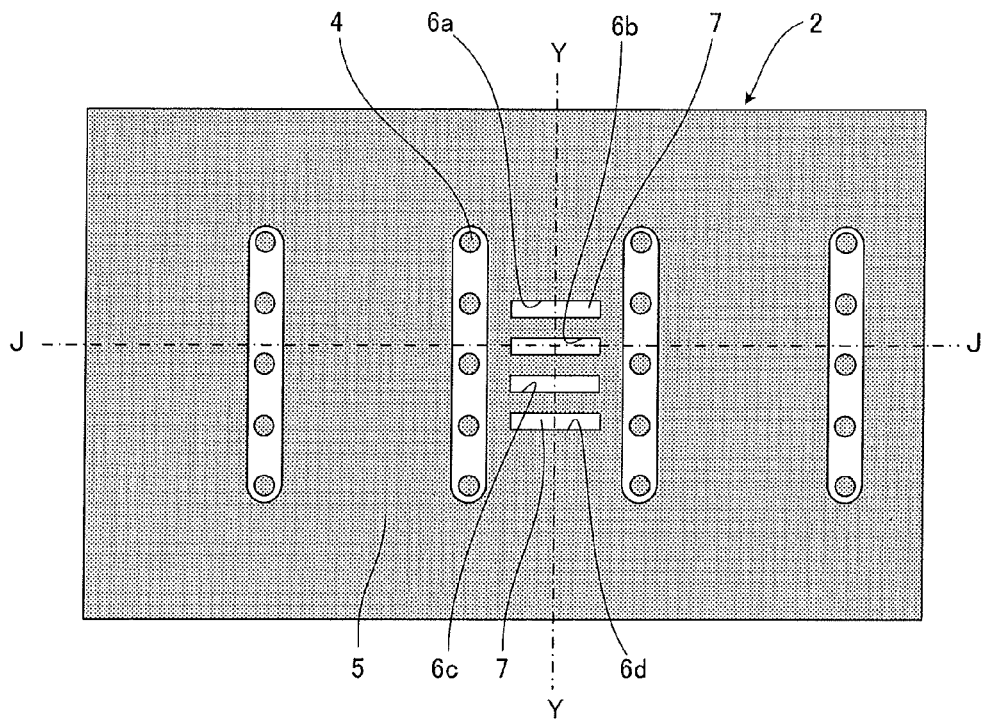
FIG. 2A is a plan view showing a circuit board before semiconductor elements of the first embodiment are mounted.
Figure 2B:
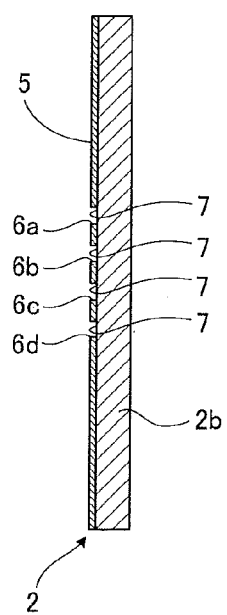
FIG. 2B is a sectional view taken along line J-J according to the first embodiment.

As shown in FIG. 2A, before the semiconductor elements 1b and 1b are mounted, a ground pattern 5 is formed over the mounting surface of the circuit board 2 except for lands 4 on which the semiconductor elements 1b and 1b are mounted. FIG. 2B is a sectional view taken along line Y-Y of FIG. 2A. Between the mounting location of the semiconductor element 1b and the mounting location of the semiconductor element 1b, windows 6a, 6b, 6c, and 6d are formed as groove sections 7 by removing the copper foil of the ground pattern 5 to a base plate 2b.

The ends of the windows 6a to 6d (groove sections 7) extend at least to around the edges of the mounting locations of the semiconductor elements. It is more preferable that as shown in FIGS. 1A and 1B, the ends of the windows 6a to 6d are formed to extend to locations where the semiconductor elements are formed, that is, under the semiconductor elements 1b and 1b.

To be specific, the semiconductor elements 1b and 1b are rectangles of 12 mm×17 mm in plan view and a distance between the semiconductor elements 1b and 1b is 2 mm. The four groove sections 7 were 20 µm in depth, 0.5 mm in width, and 3 mm in length and were formed at intervals of 0.5 mm perpendicularly to the sides of the semiconductor elements 1b and 1b.

Figure 3A:
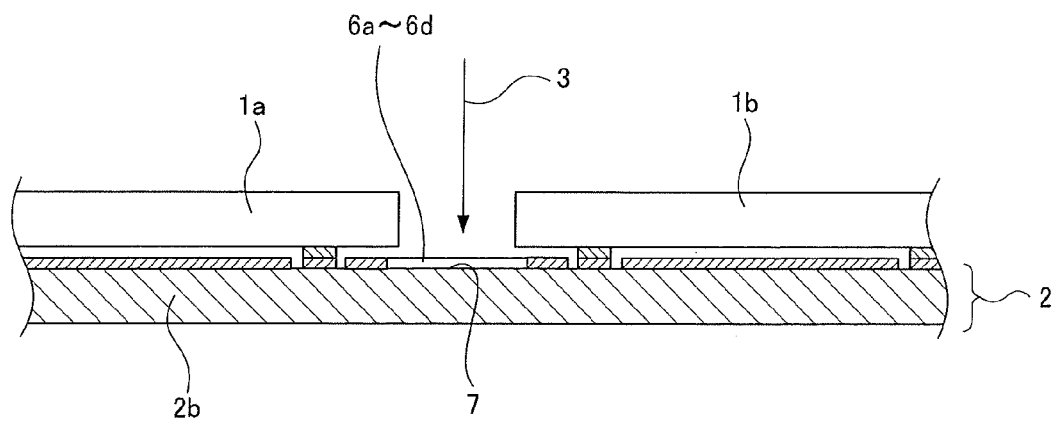
FIG. 3A is a first process drawing showing a low-viscosity resin material applied dropwise according to the first embodiment.
Figure 3B:
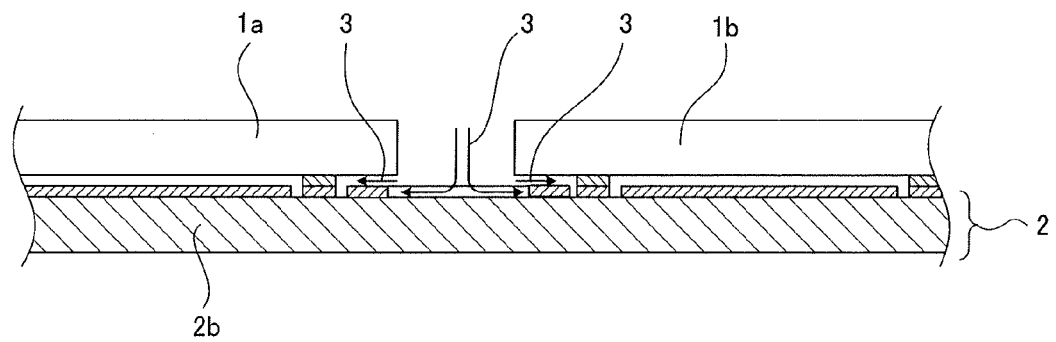
FIG. 3B is a second process drawing showing the low-viscosity resin material applied dropwise according to the first embodiment.

FIGS. 3A and 3B are enlarged sectional views taken along line J-J of FIG. 2A. The windows 6a to 6d acting as the groove sections 7 were formed on the circuit board 2, so that as shown in FIG. 3A, the low-viscosity underfill resin 3 applied dropwise at a time to a point 8 of the windows 6a to 6d with a syringe and the like did not spread along the ground pattern 5 but concentrically expanded from the point of application with the passage of time. Further, the underfill resin 3 was guided by the groove sections 7 and efficiently flowed between the semiconductor elements 1b and 1b and the circuit board 2. As shown in FIG. 3B, the underfill resin 3 flowed under the semiconductor elements 1b and 1b along the groove sections 7, achieving satisfactory molding as shown in FIG. 1B.

In this configuration, the underfill resin 3 is thermosetting epoxy resin having a low viscosity. The viscosity is preferably 10 Pa·s or less, more preferably 5 Pa·s or less, and still more preferably about 1 Pa·s.

According to Example 1 configured thus, 50 ml of the underfill resin 3 was applied dropwise around the points of the 50 mounting structures at 25° C. by using a stainless nozzle (for example, SN-26G-LF of nozzle gauge of Musashi Engineering, Inc.). After 30 minutes, fillet shapes formed between the perimeters of the undersides of the two semiconductor elements 1a and 1b and the circuit board 2 were observed. The applied underfill resin had a viscosity of 0.8 Pa·s and was cured at 150° C. for three minutes. The amount of the underfill resin 3 was set so as to fill spaces between the semiconductor elements 1b and 1b and the circuit board 2.

Figure 9A:
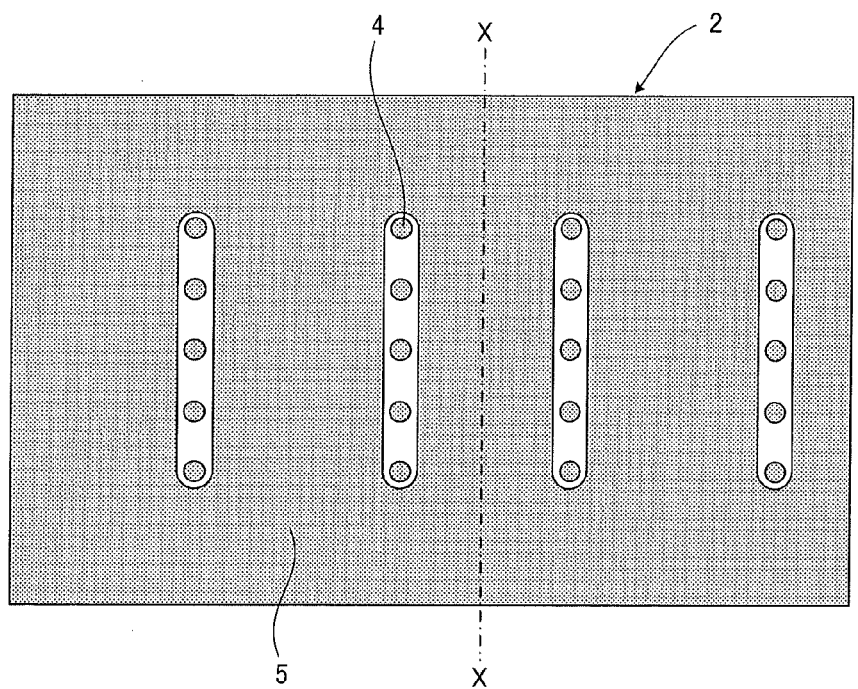
FIG. 9A is a plan view showing a circuit board of the prior art before semiconductor elements are mounted.
Figure 9B:
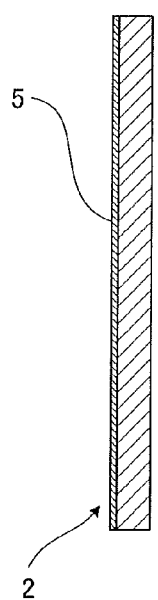
FIG. 9B is a sectional view taken along line X-X of FIG. 9A.

For comparison with Example 1, as shown in FIGS. 9A and 9B, an experiment was conducted using a circuit board 2 not including the windows 6a to 6d (groove sections 7) of FIGS. 2A and 2B. The underfill resin 3 was applied dropwise at a time to the same position under the same conditions as in Example 1.

The following table shows the results of Example 1 and Comparative example 1. In Example 1 and Comparative example 1, the mounting structures in which fillets had been formed around both of the two semiconductor elements were determined to be "Good". The mounting structures in which fillets had been partially formed around the semiconductor elements were determined to be "Poor". The fillet is a underfill resin part protruding from the semiconductor element, that is, an inclined part on the side of the semiconductor element.

TABLE 1

|  | Ex. 1 | Com. Ex. 1 |
| --- | --- | --- |
| Fillet formed all around | 50 | 21 |
| Fillet partially formed | 0 | 29 |
| Result | Good | Poor |

In Example 1, fillets were formed around the undersides of the two semiconductor elements 1b and 1b in all of the mounting structures.

When the circuit board 2 not including the windows 6a to 6d (groove sections 7) was used as in Comparative example 1, fillets were partially formed in about a half of the mounting structures. An observation of the uncompleted fillet proved that the underfill resin had been expanded but retained between the two semiconductor elements and thus the underfill resin had not been supplied to the semiconductor elements.

According to the foregoing experiment, it is understood that the underfill resin applied dropwise at a time tends to extend along the windows 6a to 6d acting as the groove sections 7. Further, the underfill resin in contact with the semiconductor elements 1b and 1b is caused to flow under the semiconductor elements by capillarity.

In Example 1, a distance between the semiconductor elements 1b and 1b was 2 mm. The distance is preferably 5 mm or less and more preferably 3 mm or less. The underfill resin is guided by the four groove sections 7. When the semiconductor elements 1b and 1b are rectangles of 12 mm×17 mm in plan view and the groove sections 7 are 20 μm in depth, the number of groove sections 7 is not limited as long as the sum of the widths of the groove sections 7 for guiding the underfill resin is at least 5% of the length of the sides of the semiconductor elements 1b and 1b. Preferably, the sum of the widths of the groove sections 7 is about 10%.

Furthermore, in Examples 2, 3, and 4, the shapes of the windows 6a to 6d (groove sections 7) were respectively 5 μm, 10 μm, and 30 μM in depth, were 0.5 mm in width, and were 3 mm in length. Moreover, in Comparative examples 2 and 3, the shapes of the windows 6a to 6d (groove sections 7) were respectively 1 μm and 3 in depth, were 0.5 mm in width, and were 3 mm in length. The mounting structures in which fillets had been formed around both of the two semiconductor elements were determined to be "Good". The mounting structures in which fillets had been partially formed around the semiconductor elements were determined to be "Poor".

TABLE 2

|  | Ex. 2 | Ex. 3 | Ex. 4 | Com. Ex. 2 | Com. Ex. 3 |
| --- | --- | --- | --- | --- | --- |
| Fillet formed all around | 48 | 50 | 50 | 18 | 26 |
| Fillet partially formed | 2 | 0 | 0 | 32 | 24 |
| Result | Good | Good | Good | Poor | Poor |

Although uncompleted fillets were found on about two of the circuit boards 2 in Example 2, it is determined that Example 2 is applicable to practical use. In Examples 3 and 4, fillets were formed on all of the mounting structures. In Comparative examples 2 and 3, any results did not reach the practical level. According to these results, the windows 6a to 6d (groove sections 7) require a depth of at least 5 μm to control the expansion of the underfill resin in a fixed direction. The windows 6a to 6d (groove sections 7) act like a river that guides water into the sea. When the windows 6a to 6d are 5 μm or less in depth, the state of the windows is similar to a burst of a river having a low bank. Consequently, the windows 6a to 6d (groove sections 7) require a depth of at least 5 μm. Preferably, the windows 6a to 6d may be 10 μm to 50 μm or larger in depth.

According to the foregoing explanation, as to the depths of the windows 6a to 6d (groove sections 7), grooves with a desired depth are obtained by partially removing the copper foil of the circuit board 2 as shown in FIG. 2B. One of the configurations of FIGS. 4A and 4B can be used.

Figure 4A:
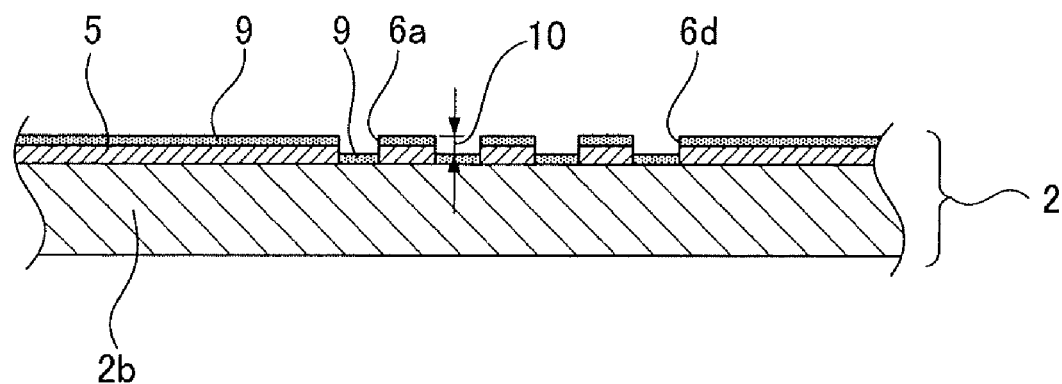
FIG. 4A is a sectional view showing a first specific example of the circuit board according to the first embodiment.
Figure 4B:
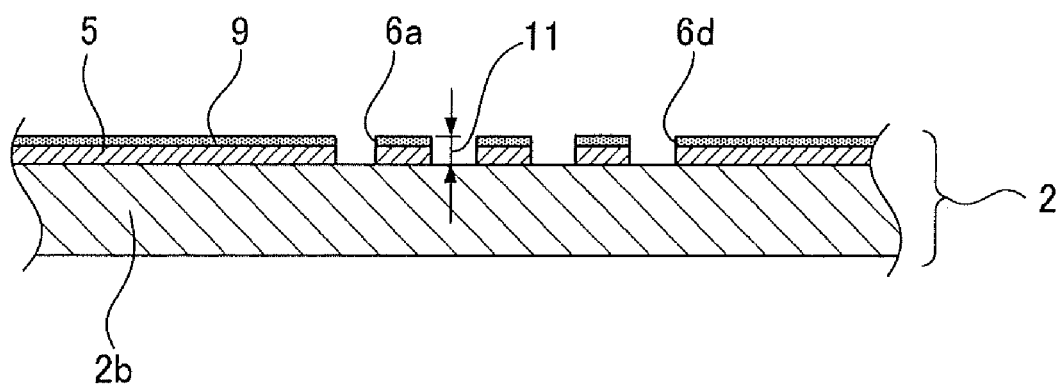
FIG. 4B is a sectional view showing a second specific example of the circuit board according to the first embodiment.

FIGS. 4A and 4B are sectional views taken along line J-J of FIG. 2A. In FIG. 4A, resist 9 acting as a solder masking agent is formed on the top surface of the ground pattern 5 and the bottoms of the windows 6a to 6d. In this case, a dimension 10 is equivalent to the depth of the groove section 7. In FIG. 4B, the resist 9 is formed on the top surface of the ground pattern 5 but is not formed on the bottoms of the windows 6a to 6d. In this case, a dimension 11 is equivalent to the depth of the groove section 7.

Second Embodiment

Figure 5:
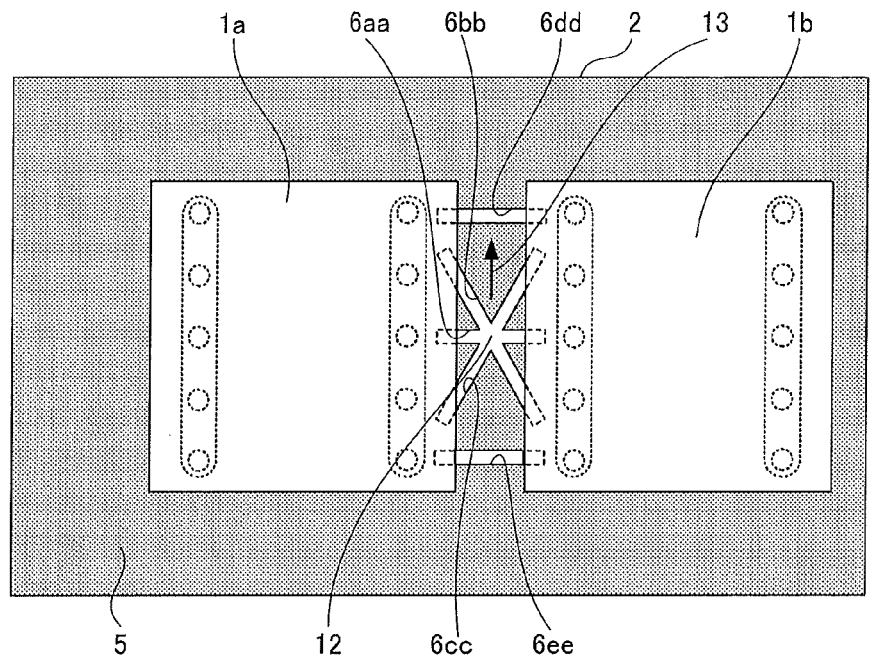
FIG. 5 is a plan view showing a mounting structure according to a second embodiment of the present invention.

FIG. 5 shows a second embodiment of the present invention.

In the first embodiment, the groove sections 7 formed by the windows 6a to 6d are all perpendicular to the sides of the semiconductor elements 1b and 1b, whereas in the second embodiment, provided are a groove section 7 of a window 6aa forming a groove perpendicular to the sides of semiconductor elements 1b and 1b and groove sections 7 of windows 6bb and 6cc forming grooves with angles smaller than a right angle relative to the sides of the semiconductor element 1b and 1b. The groove sections 7 of the windows 6aa, 6bb, and 6cc communicate with one another through a recessed portion 12 formed between the semiconductor elements 1b and 1b. Further, in order to reduce an external flow of low-viscosity underfill resin that is applied dropwise and fails to be captured by the groove sections 7 of the windows 6bb and 6cc as indicated by an arrow 13, groove sections 7 having windows 6dd and 6ee perpendicular to the sides of the semiconductor elements 1b and 1b are formed outside the groove sections of the windows 6bb and 6cc when necessary. Thus the underfill resin is guided to the semiconductor elements 1b and 1b as much as possible.

Moreover, the recessed portion 12 and the groove sections 7 of the windows 6dd and 6ee are configured by partially removing the copper foil of a ground pattern 5 like the groove sections 7 of the windows 6aa, 6bb, and 6cc. Other configurations are similar to those of the first embodiment.

Third Embodiment

Figure 6:
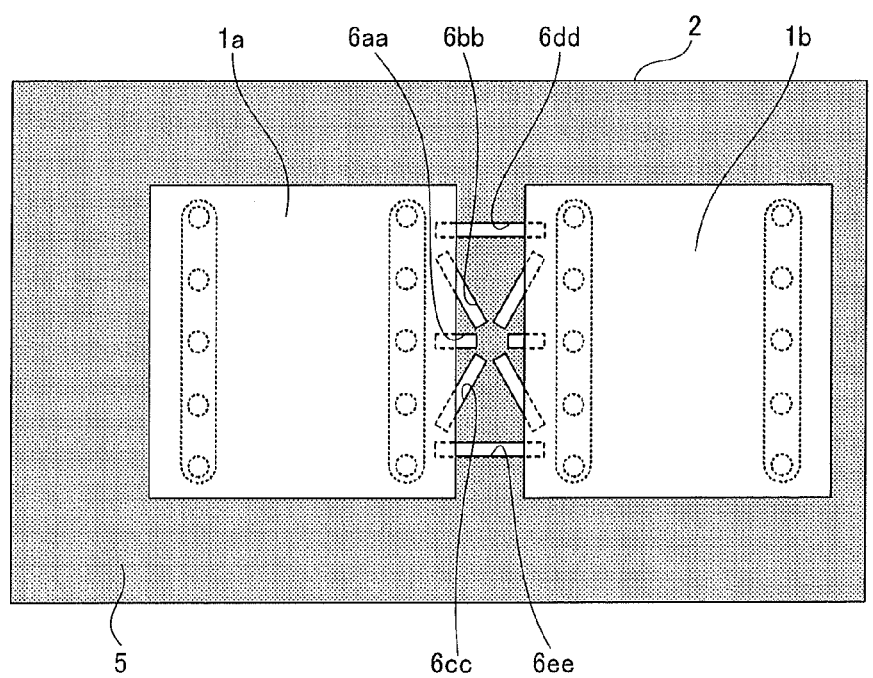
FIG. 6 is a plan view showing a mounting structure according to a third embodiment of the present invention.

FIG. 6 shows a third embodiment of the present invention.

In the second embodiment, the groove section 7 of the windows 6aa and the groove sections 7 of the windows 6bb and 6cc communicate with one another through the recessed portion 12 formed between the semiconductor elements 1b and 1b, whereas in another effective configuration illustrated in the third embodiment, one end of a groove section 7 of a window 6aa and one ends of groove sections of windows 6bb and 6cc are just formed close to each other.

Fourth Embodiment

Figure 7:
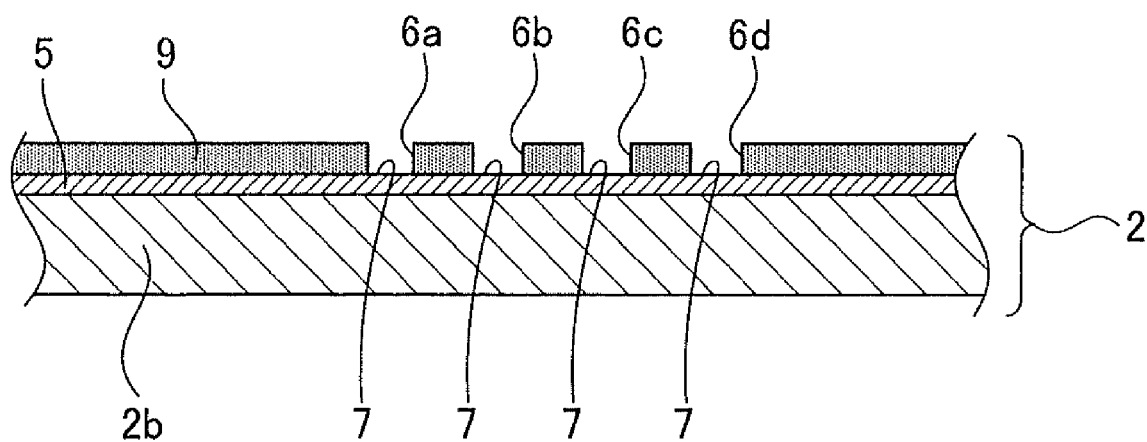
FIG. 7 is a sectional view showing the main part of a mounting structure according to a fourth embodiment of the present invention.
Figure 8A:
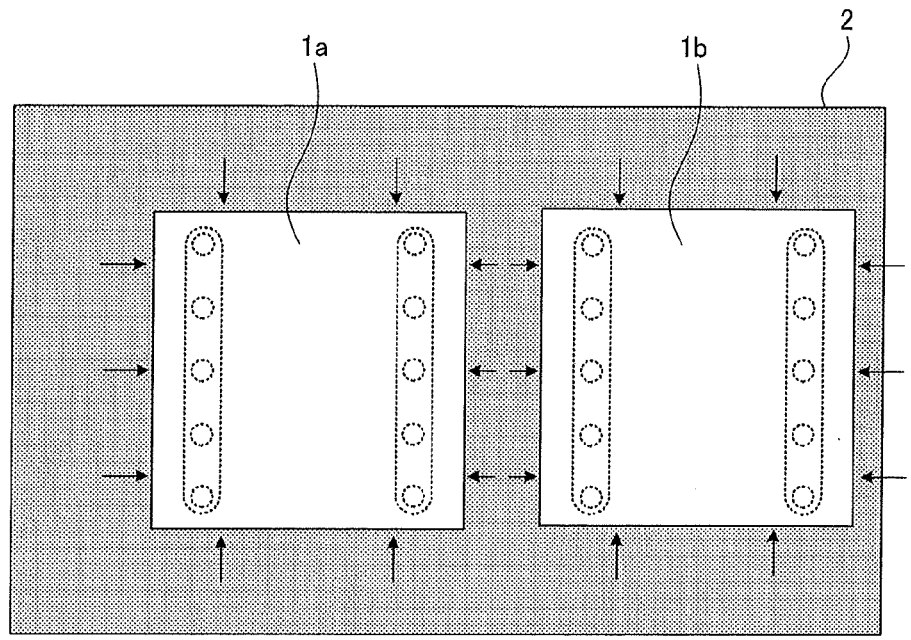
FIG. 8A is a plan view showing a mounting structure of the prior art.
Figure 8B:
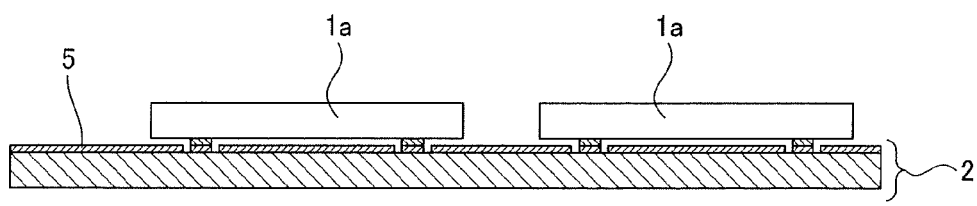
FIG. 8B is a sectional view showing a state before a low-viscosity resin material is applied dropwise to the mounting structure of the prior art.
Figure 8C:
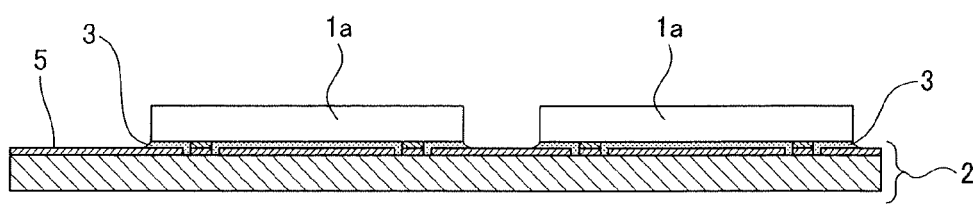
FIG. 8C is a sectional view showing a state after the low-viscosity resin material is applied dropwise to the mounting structure of the prior art.

In the foregoing embodiments, as the groove sections 7 for guiding the underfill resin 3 to a gap between the semiconductor element 1b and the circuit board 2 and a gap between the semiconductor element 1b and the circuit board 2, the groove sections 7 of the windows 6a to 6c and the groove sections 7 of the windows 6aa to 6cc, 6dd, and 6ee are configured by removing the copper foil of the ground pattern 5 of the circuit board 2, whereas as shown in FIG. 7, when the copper foil of a ground pattern 5 is not removed and resist 9 is applied and formed on the ground pattern 5, a mask is used with a pattern that forms, for example, windows 6a to 6c not to be coated with the resist 9. Thus only by the thickness of the resist 9, groove sections 7 can be formed so deeply that low-viscosity underfill resin 3 applied dropwise is guided under semiconductor elements 1b and 1b.

The foregoing embodiments described LGA (Land Grid Array) packages. The present invention is not limited to LGA packages and even semiconductor elements in other patterns such as a BGA (Ball Grid Array) can be used when mounted and molded on circuit boards. Although the number of semiconductor elements was two in the foregoing embodiments, at least three semiconductor elements may be mounted.

INDUSTRIAL APPLICABILITY

The mounting structure of the present invention can contribute to an improvement in the reliability of various kinds of electronic equipment having a mounting structure in which a gap between a circuit board and a semiconductor element is molded with underfill resin.

The invention claimed is:

1. A mounting structure in which a first semiconductor element and a second semiconductor element are surface-mounted adjacent to each other on a top surface of a circuit board,
wherein the mounting structure has a plurality of groove sections formed between the adjacent semiconductor elements on a pattern of the circuit board,
the first semiconductor element is mounted so that one end of the groove section is positioned beneath the first semiconductor,
the second semiconductor element is mounted so that the other end of the groove section is positioned beneath the second semiconductor,
a gap between the pattern of the circuit board and the first semiconductor element is molded with underfill resin, and
a gap between the pattern of the circuit board and the second semiconductor element is molded with the underfill resin,
at least two groove sections out of the plurality of the groove sections are oriented perpendicularly to directions of sides of the first and second semiconductor elements that face each other.

2. The mounting structure according to claim 1, wherein the underfill resin is formed over at least one of the groove sections.

3. The mounting structure according to claim 1, wherein the first semiconductor element and the second semiconductor element are spaced at an interval not larger than 5 mm.

4. The mounting structure according to claim 1, wherein at least one of the groove section is sufficiently deep to guide the underfill resin supplied into the groove section to the gap between the pattern of the circuit board and the first semiconductor element and the gap between the pattern of the circuit board and the second semiconductor element.

5. A mounting structure in which a first semiconductor element and a second semiconductor element are surface-mounted adjacent to each other on a top surface of a circuit board,
wherein the mounting structure has a plurality of groove section formed between the adjacent semiconductor elements on a resist formed on a pattern of the circuit board,
the first semiconductor element is mounted so that one end of the groove section is positioned beneath the first semiconductor,
the second semiconductor element is mounted so that the other end of the groove section is positioned beneath the second semiconductor,
a gap between the pattern of the circuit board and the first semiconductor element is molded with underfill resin, and
a gap between the pattern of the circuit board and the second semiconductor element is molded with the underfill resin,
at least two groove sections out of the plurality of the groove sections are oriented perpendicularly to directions of sides of the first and second semiconductor elements that face each other.

6. The mounting structure according to claim 5, wherein the underfill resin is formed over at least one of the groove sections.

7. The mounting structure according to claim 5, wherein the first semiconductor element and the second semiconductor element are spaced at an interval not larger than 5 mm.

8. A mounting structure in which a first semiconductor element and a second semiconductor element are surface-mounted adjacent to each other on a top surface of a circuit board,
wherein the mounting structure has a groove section formed between the adjacent semiconductor elements on a pattern of the circuit board,
the first semiconductor element is mounted so that one end of the groove section is positioned beneath the first semiconductor,
the second semiconductor element is mounted so that the other end of the groove section is positioned beneath the second semiconductor,
a gap between the pattern of the circuit board and the first semiconductor element is molded with underfill resin, and
a gap between the pattern of the circuit board and the second semiconductor element is molded with the underfill resin,
a plurality of the groove sections are formed, and
the plurality of groove sections comprise a first groove section and a second groove section perpendicular to a side of the first semiconductor element and a side of the second semiconductor elements respectively that face each other, and a third groove section and a fourth groove section not perpendicular to the respective sides of the first and second semiconductor element, the third groove section and the fourth groove section being positioned between the first groove section and the second groove section.

9. The mounting structure according to claim 8, wherein the third groove section and the fourth groove section intersect each other.

* * * * *